United States Patent
Rajeev et al.

(10) Patent No.: US 12,057,325 B2
(45) Date of Patent: *Aug. 6, 2024

(54) GASBOX FOR SEMICONDUCTOR PROCESSING CHAMBER

(71) Applicant: Applied Materials, Inc., Santa Clara, CA (US)

(72) Inventors: Rahul Rajeev, Sunnyvale, CA (US); Yunzhe Yang, San Jose, CA (US); Abhijit A. Kangude, San Jose, CA (US); Kedar Joshi, Mountain View, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 18/346,433

(22) Filed: Jul. 3, 2023

(65) Prior Publication Data
US 2023/0343608 A1 Oct. 26, 2023

Related U.S. Application Data

(63) Continuation of application No. 17/077,674, filed on Oct. 22, 2020, now Pat. No. 11,694,908.

(51) Int. Cl.
*H01J 37/32* (2006.01)
*C23C 16/50* (2006.01)
*H01L 21/67* (2006.01)

(52) U.S. Cl.
CPC ........ *H01L 21/67017* (2013.01); *C23C 16/50* (2013.01); *H01J 37/3244* (2013.01);
(Continued)

(58) Field of Classification Search
CPC ............... H01L 21/67017; C23C 16/50; H01J 37/3244; H01J 37/32715; H01J 37/32899; H01J 2237/332
(Continued)

(56) References Cited

U.S. PATENT DOCUMENTS 8,069,817 B2* 12/2011 Fischer ............... C23C 16/4557
156/345.43
8,771,418 B2* 7/2014 Je ...................... C23C 16/45565
156/345.33
(Continued)

FOREIGN PATENT DOCUMENTS

KR 20200074663 A 6/2020
TW 201250833 A 12/2012
(Continued)

OTHER PUBLICATIONS

Application No. PCT/US2021/055459, International Preliminary Report on Patentability, Mailed On May 4, 2023, 7 pages.
(Continued)

*Primary Examiner* — Rudy Zervigon
(74) *Attorney, Agent, or Firm* — Kilpatrick Townsend & Stockton LLP (57) ABSTRACT

Exemplary semiconductor processing chambers may include a gasbox including a first plate having a first surface and a second surface opposite to the first surface. The first plate of the gasbox may define a central aperture that extends from the first surface to the second surface. The first plate may define an annular recess in the second surface. The first plate may define a plurality of apertures extending from the first surface to the annular recess in the second surface. The gasbox may include a second plate characterized by an annular shape. The second plate may be coupled with the first plate at the annular recess to define a first plenum within the first plate.

19 Claims, 6 Drawing Sheets

(52) U.S. Cl.
CPC .. *H01J 37/32715* (2013.01); *H01J 37/32899* (2013.01); *H01J 2237/332* (2013.01)

(58) Field of Classification Search
USPC .................. 118/715; 156/345.33, 345.34
See application file for complete search history.

(56) References Cited

U.S. PATENT DOCUMENTS

| | | | |
|---|---|---|---|
| 9,057,128 B2* | 6/2015 | Olgado | C23C 16/45572 |
| 9,732,424 B2 | 8/2017 | Lee et al. | |
| 11,482,418 B2* | 10/2022 | Nakano | C23C 16/45576 |
| 11,555,244 B2* | 1/2023 | Lei | C23C 16/45565 |
| 11,694,908 B2 | 7/2023 | Rajeev et al. | |
| 2005/0173569 A1* | 8/2005 | Noorbakhsh | C23C 16/45565 |
| | | | 239/690 |
| 2006/0219362 A1* | 10/2006 | Han | H01J 37/3244 |
| | | | 156/345.33 |
| 2008/0206483 A1 | 8/2008 | Paterson et al. | |
| 2014/0020834 A1 | 1/2014 | Zhou et al. | |
| 2015/0024582 A1 | 1/2015 | Taylor | |
| 2019/0189401 A1 | 6/2019 | Singh et al. | |

FOREIGN PATENT DOCUMENTS

| | | |
|---|---|---|
| TW | 201443273 A | 11/2014 |
| TW | 201928109 A | 7/2019 |

OTHER PUBLICATIONS

Application No. PCT/US2021/055459, International Search Report and Written Opinion, Mailed On Feb. 9, 2022, 10 pages.

* cited by examiner

GASBOX FOR SEMICONDUCTOR PROCESSING CHAMBER

CROSS-REFERENCE TO RELATED APPLICATION

This application is a continuation of U.S. Non-provisional patent application Ser. No. 17/077,674, filed Oct. 22, 2020, the content of which is hereby incorporated by reference in its entirety for all purposes.

TECHNICAL FIELD

The present technology relates to components and apparatuses for semiconductor manufacturing. More specifically, the present technology relates to processing chamber distribution components and other semiconductor processing equipment.

BACKGROUND

Integrated circuits are made possible by processes that produce intricately patterned material layers on substrate surfaces. Producing patterned material on a substrate requires controlled methods for forming and removing material. Chamber components often deliver processing gases to a substrate for depositing films or removing materials. To promote symmetry and uniformity, many chamber components may include regular patterns of features, such as apertures, for providing materials in a way that may increase uniformity. However, this may limit the ability to tune recipes for on-wafer adjustments.

Thus, there is a need for improved systems and methods that can be used to produce high quality devices and structures. These and other needs are addressed by the present technology.

SUMMARY

Exemplary semiconductor processing chambers may include a gasbox including a first plate having a first surface and a second surface opposite to the first surface. The first plate of the gasbox may define a central aperture that extends from the first surface to the second surface. The first plate may define an annular recess in the second surface. The first plate may define a plurality of apertures extending from the first surface to the annular recess in the second surface. The gasbox may include a second plate characterized by an annular shape. The second plate may be coupled with the first plate at the annular recess to define a first plenum within the first plate.

In some embodiments, the first plate further defines a recessed channel within the first surface of the first plate. The recessed channel may extend about the central aperture. The recessed channel may extend from a first position to a plurality of second positions fluidly accessing the plurality of apertures extending from the first surface of the first plate. The gas boxes may include a cover plate overlying the recessed channel and forming a second plenum within the first plate. The annular recess defined in the second surface may include a stepped recess. The second plate may couple with a step feature of the annular recess. The second plate may define a plurality of outlet apertures providing fluid access from the first plenum. The first plate may define an annular channel extending about the central aperture through the first plate. The first plate may define a plurality of lateral channels extending from the annular channel to an exterior edge of the semiconductor processing chamber gasbox. The lateral channels may not intersect any aperture of the plurality of apertures extending through the first plate. The first plate may define a plurality of bypass apertures extending from the lateral channels through the second surface of the semiconductor processing chamber gasbox.

Some embodiments of the present technology may encompass semiconductor processing chambers including a manifold providing fluid access to the chamber for a plurality of fluids. The chambers may include a gasbox including a first plate having a first surface and a second surface opposite to the first surface. The first plate may define a central aperture that extends from the first surface to the second surface. The first plate may define an annular recess in the second surface. The first plate may define a plurality of apertures extending from the first surface to the annular recess in the second surface. The gasbox may include a second plate characterized by an annular shape. The second plate may be coupled with the first plate at the annular recess to define a first plenum within the first plate.

In some embodiments, the manifold may include an interior zone coupled with a first fluid delivery channel. The manifold may include an exterior zone extending about and fluidly isolated from the interior zone. The exterior zone may be coupled with a second fluid delivery channel. The first plate may define an annular channel extending about the central aperture through the first plate. The annular channel may be fluidly coupled with the exterior zone of the manifold. The first plate may define a recessed channel within the first surface of the first plate. The recessed channel may extend about the central aperture. The recessed channel may extend from a first position to a plurality of second positions fluidly accessing the plurality of apertures extending from the first surface of the first plate. The chambers may include a cover plate overlying the recessed channel and forming a second plenum within the first plate. The systems may include a substrate support. The systems may include a blocker plate positioned between the gasbox and the substrate support. A first volume may be defined between the gasbox and the blocker plate. The first volume may be fluidly accessible from the central aperture and from the plurality of peripheral apertures. The chamber may include a faceplate, and the faceplate may be positioned between the blocker plate and the substrate support. A second volume may be defined between the blocker plate and the faceplate. The second volume may be fluidly accessible from a lateral channel extending through the gasbox.

Such technology may provide numerous benefits over conventional systems and techniques. For example, embodiments of the present technology may allow controlled dilution and distribution of precursors over inner and outer regions of a substrate. Additionally, the chambers and components may allow various ratios of precursors and the inert gases to be provided to the inner and outer regions of the substrate. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Plasma enhanced deposition processes may energize one or more constituent precursors to facilitate film formation on a substrate. Any number of material films may be produced to develop semiconductor structures, including conductive and dielectric films, as well as films to facilitate transfer and removal of materials. For example, hardmask films may be formed to facilitate patterning of a substrate, while protecting the underlying materials to be otherwise maintained. In many processing chambers, a number of precursors may be mixed in a gas panel and delivered to a processing region of a chamber where a substrate may be disposed. The precursors may be distributed through one or more components within the chamber, which may produce a radial or lateral uniformity of delivery to provide increased formation or removal at the substrate surface.

As device features reduce in size, tolerances across a substrate surface may be reduced, and material property differences across a film may affect device realization and uniformity. Many chambers include a characteristic process signature, which may produce non-uniformity across a substrate. Temperature differences, flow pattern uniformity, and other aspects of processing may impact the films on the substrate, creating film property differences as well as differences across the substrate for materials produced or removed. Adjusting processes at different regions of the substrate, such as for in-plane distortion issues and other film property challenges, may be difficult to improve with uniform delivery chamber components, and many conventional technologies have been limited in the adjustments available, or may require specialized components to be produced.

The present technology overcomes these challenges by utilizing one or more chamber components that may facilitate delivery adjustments which may increase or decrease delivery of precursors, such as with dilution utilizing precursors or inert materials, or may afford avenues for material adjustments to the films based on additional precursor inclusion or modulation. Accordingly, improved film formation and removal, as well as improved film properties, may be afforded.

Although the remaining disclosure will routinely identify specific deposition processes utilizing the disclosed technology, it will be readily understood that the systems and methods are equally applicable to other deposition and cleaning chambers, as well as processes as may occur in the described chambers. Accordingly, the technology should not be considered to be so limited as for use with these specific deposition processes or chambers alone. The disclosure will discuss one possible system and chamber that may include lid stack components according to embodiments of the present technology before additional variations and adjustments to this system according to embodiments of the present technology are described.

Figure 1:
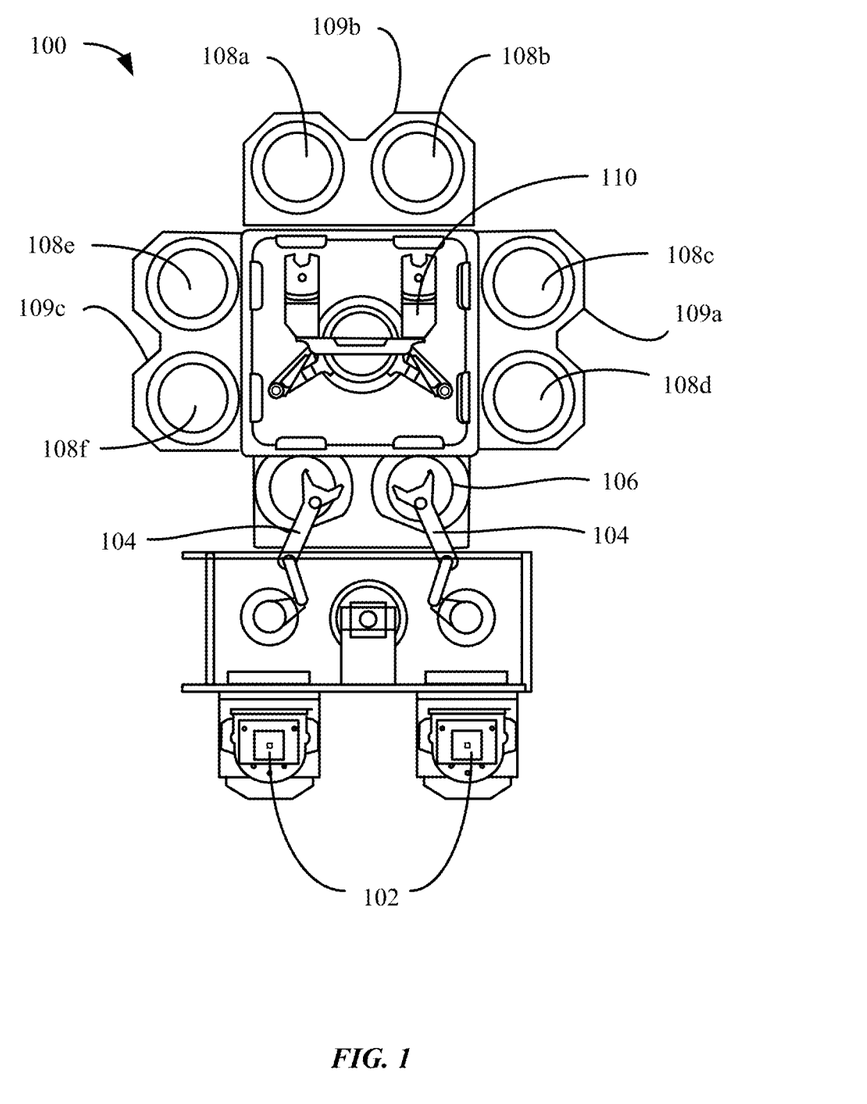
FIG. 1 shows a top view of an exemplary processing system according to some embodiments of the present technology.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing and/or etching a dielectric or other film on the substrate. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
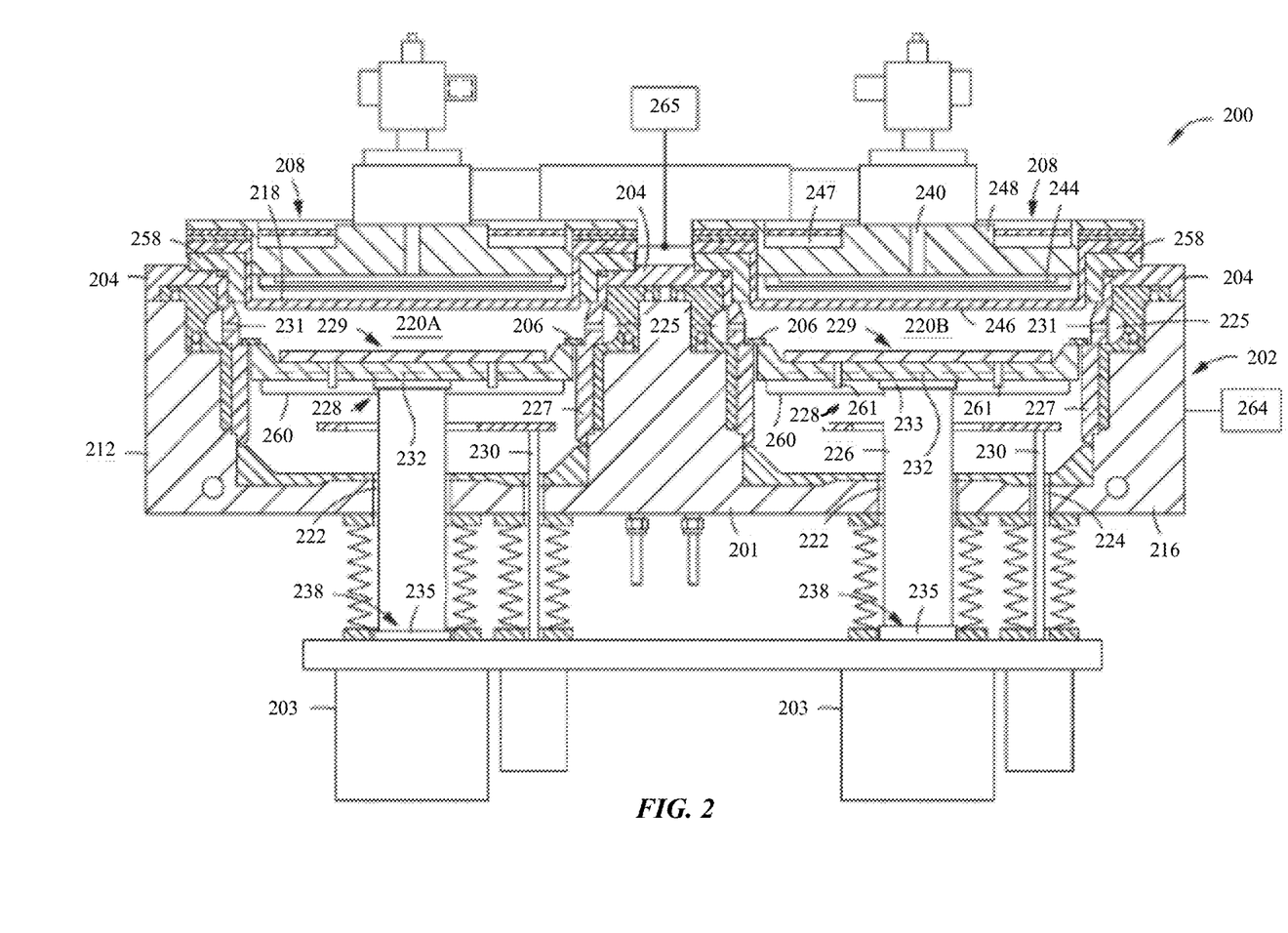
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include substrate support assemblies according to embodiments of the present technology. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a dual-channel showerhead 218 into the processing region 220B. The dual-channel showerhead 218 may include an annular base plate 248 having a blocker plate 244 disposed intermediate to a faceplate 246. A radio frequency ("RF") source 265 may be coupled with the dual-channel showerhead 218, which may power the dual-channel showerhead 218 to facilitate generating a plasma region between the faceplate 246 of the dual-channel showerhead 218 and the pedestal 228. In some embodiments, the RF source may be coupled with other portions of the chamber body 202, such as the pedestal 228, to facilitate plasma generation. A dielectric isolator 258 may be disposed between the lid 204 and the dual-channel showerhead 218 to prevent conducting RF power to the lid 204. A shadow ring 206 may be disposed on the periphery of the pedestal 228 that engages the pedestal 228.

An optional cooling channel 247 may be formed in the annular base plate 248 of the precursor distribution system 208 to cool the annular base plate 248 during operation. A heat transfer fluid, such as water, ethylene glycol, a gas, or the like, may be circulated through the cooling channel 247 such that the base plate 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
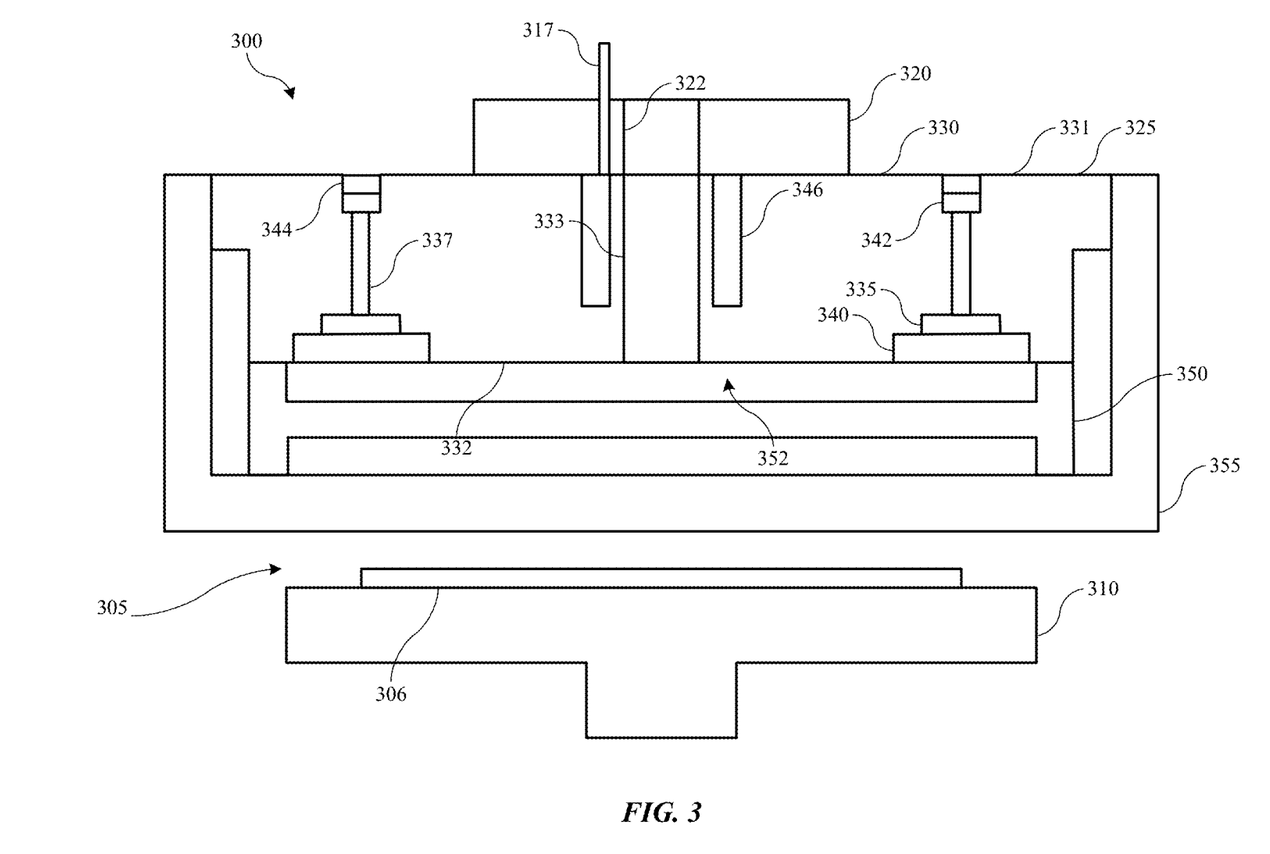
FIG. 3 shows a schematic partial cross-sectional view of an exemplary semiconductor processing chamber according to some embodiments of the present technology.

FIG. 3 shows a schematic partial cross-sectional view of an exemplary semiconductor processing chamber 300 according to some embodiments of the present technology. FIG. 3 may include one or more components discussed above with regard to FIG. 2, and may illustrate further details relating to that chamber. Chamber 300 is understood to include any feature or aspect of system 200 discussed previously in some embodiments. The chamber 300 may be used to perform semiconductor processing operations including deposition of hardmask materials as previously described, as well as other deposition, removal, and cleaning operations. Chamber 300 may show a partial view of a processing region of a semiconductor processing system, and may not include all of the components, such as a remote plasma unit as illustrated previously, and which are understood to be incorporated in some embodiments of chamber 300.

As noted, FIG. 3 may illustrate a portion of a processing chamber 300. The chamber 300 may include a number of lid stack components, which may facilitate delivery or distribution of materials through the processing chamber into a processing region 305, such as where a substrate 306 may be positioned on a substrate support or pedestal 310, for example. A chamber lid plate may extend across one or more plates of the lid stack and may provide structural support for components, such as a remote plasma unit illustrated previously for system 200. The lid plate may provide access, such as through an aperture to an internal volume of processing chamber 300. An output manifold 320 may be positioned on or associated with a gasbox and may provide coupling with a remote plasma unit, which may provide precursors or plasma effluents for chamber cleaning or other processing operations. Output manifold 320 may define a central aperture 322, which may extend about a central axis of the chamber or output manifold. Additionally, a separate bypass 317 may be included, which may provide access for a cleaning gas or flow from an RPS in some embodiments. Processing chamber 300 may also include a gasbox 325, on which one or more of the components may be positioned.

Gasbox 325 may be characterized by a first plate 330 having a first surface 331 and a second surface 332 that may be opposite the first surface. The first plate of the gasbox may define a central aperture 333, which may extend fully through the gasbox from the first surface to the second surface. The central aperture 333 may be axially aligned with the central aperture of the output manifold 320, and may be axially aligned with the central aperture of an insulator or any other components providing a fluid path into the chamber. The apertures may define a channel, which may be at least partially used to deliver precursors or plasma effluents from a remote plasma unit positioned on the output manifold. The first plate 330 may also define an annular recess 335 in the second surface of the gasbox. In some embodiments, the recess may be a stepped recess as illustrated, which may allow coupling of a second plate 340, which may be seated on a defined ledge within the recess. This coupling may produce a first plenum within the first plate of the gasbox, which may be an annular plenum allowing distribution of materials uniformly into the processing chamber.

The first plate of the gasbox may also define a plurality of apertures 337 extending from the first surface of the first plate to the annular recess in the second surface of the first plate. As will be described below, the apertures may provide an additional fluid path for precursors or inert gases to be delivered into the chamber. First plate 330 may also define a recessed channel 342 within the first surface of the first plate. As will be discussed further below, the recessed channel 342 may extend about the central aperture 333 in one or more ways in some embodiments of the present technology. In some embodiments the gasbox may include a cover plate 344 overlying the recessed channel 342, which may produce a second plenum within the first plate. Cover plate 344 may be formed to seat within the channel, and may be welded or bonded onto a ledge or feature of the recessed channel, which may allow sealing the second plenum with a single inlet location to be described further below, and which may have multiple outlet locations, such as through the plurality of apertures. The first plenum may be fluidly accessible with the second plenum through the apertures 337 extending through the plate. First plate 330 may also define an annular channel 346 extending about the central aperture through the first plate.

Semiconductor processing chamber 300 may also include additional components in some embodiments, such as a blocker plate 350, and a faceplate 355. Blocker plate 350 may define a number of apertures that may operate as a choke to increase radial diffusion to improve uniformity of delivery. Blocker plate 350 may be a first location through the lid stack where precursors delivered to the central aperture of the gasbox and precursors delivered through the plenums of the gasbox may intermix. As illustrated, a volume 352 may be formed or defined between the gasbox 325 and the blocker plate 350. Volume 352 may be fluidly accessible from both central aperture 333 and a plurality of outlet apertures that may be defined in the second plate 340, and which may provide fluid access from the plenum or annular recess 335 of the first plate. Precursors delivered into the zone may then at least partially mix or overlap before continuing through the lid stack. By allowing an amount of mixing prior to contacting the substrate surface, an amount of overlap may be provided, which may produce a smoother transition at the substrate, and may limit an interface from forming on a film or substrate surface. Faceplate 355 may then deliver precursors to the processing region, which may be at least partially defined from above by the faceplate. Faceplate 355 may also define an outer zone between the gasbox and the faceplate, which may allow lateral channels in the gasbox as will be described below to deliver materials to the zone, such as for cleaning operations.

To provide an additional precursor flow path through the annular channel, additional components may be incorporated to facilitate operation. For example, an isolator may be included to isolate connection components from the gas box. Gasbox 325 may be electrically coupled with faceplate 355, which may be utilized as a plasma-generating electrode. In some embodiments, components of the lid stack may operate as a plasma-generating electrode, such as a hot electrode. Consequently, delivery components, which may be at electrical ground, may benefit from an isolator decoupling associated components from the gasbox. An isolation valve may also be included in the system, and may be included between piping from a gas panel and the chamber. The valve may prevent materials from back streaming into the fluid lines during process operations in which an additional fluid may not be flowed into the processing region through the annular channel.

Figure 4:
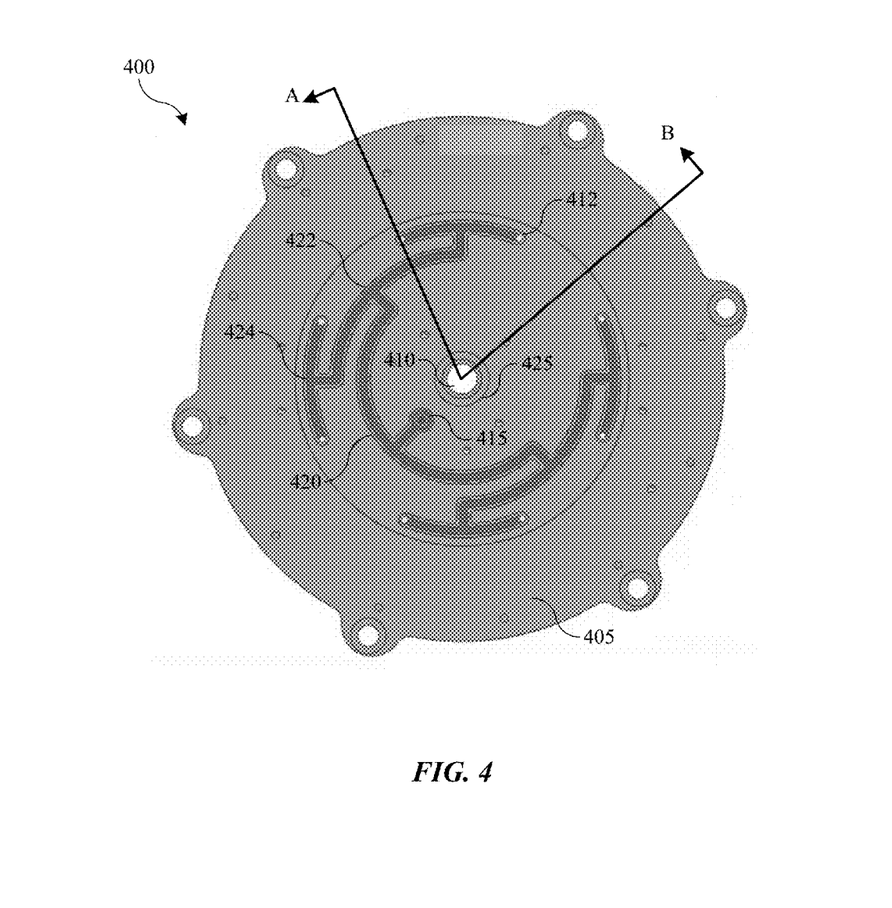
FIG. 4 shows a schematic top plan view of an exemplary gasbox according to some embodiments of the present technology.

Turning to FIG. 4 is shown a schematic top view of an exemplary gasbox 400 according to some embodiments of the present technology. The gasbox 400 may be an example of the gasbox 325 shown in FIG. 3, and may include any feature, component, or characteristic of that gasbox, such as showing a top view of the first plate discussed above. The gasbox 400 may define a central aperture 410 that extends through the entire gasbox to provide fluid access within the chamber. A second delivery position 415 may be defined to provide fluid access to a recessed channel 420, which may include a cover plate as discussed above to form a plenum, and which may provide fluid access to a number of radially outward locations on the gasbox, or the first plate of the gasbox as illustrated. Locations of apertures 412 may provide fluid access to the plurality of apertures extending through the gasbox and into the plenum formed between the second surface of the first plate and the second plate of the gasbox. As previously described, in some embodiments, a single inlet aperture may be used to distribute one or more precursors to a recessed channel formed within the first surface 405 of the gasbox. An annular channel 425 may also be formed in the gasbox extending about the central aperture, and which may provide an additional fluid or material into the chamber as will be described further below. In some embodiments, additional flow features may be formed within the gasbox, which may increase the number of locations at which precursors may be delivered into the annular channel. The exemplary configuration illustrated is not intended to be limiting to any type of recursive or outwardly extending flow paths for distributing one or more precursors prior to delivering the precursors to the plurality of apertures, and it is to be understood that any number of modifications are similarly encompassed by the present technology.

The recessed channels illustrated may show one encompassed example of conductance paths for delivered precursors, and may illustrate a recursive flow path as discussed previously, which may extend radially outward to the plurality of apertures, or may extend in a controlled pattern to radially distribute precursors for multiple positions of delivery into the first plenum. For example, on the first surface 405 of the first plate may be defined a first recessed channel 420. An aperture through a manifold, and through a cover plate on the recessed channel, may access recessed channel 420 near a middle or midpoint of the channel at position 415, which may allow a delivered precursor to then travel in two directions along the channel. For example, in some embodiments recessed channel 420 may be a bidirectional channel defined in the plate or gasbox, which may distribute delivered precursors in two directions radially or laterally outward from the position at which the precursors are delivered to the plate.

Recessed channel 420 may extend to two or more distal ends, which may each access an additional bidirectional channel in one embodiment as illustrated, although the channels may extend to more or less channels, including to third bidirectional channels, which may provide access to the plurality of apertures through the gasbox. As illustrated, the distribution at a first distal end of first recessed channel 420 may provide access to two second recessed channels 422, which may also be a second bidirectional channel as illustrated. Additionally, the distribution at the distal end of second recessed channels 422 may provide access to set of third recessed channels 424, which may also be a third bidirectional channels as illustrated. Although four such additional channels are illustrated, it is to be understood that any number of channels may be included, such as 2, 3, 4, 6, 8, or more channels in embodiments of the present technology.

The second and third channels may have similar or different configurations, and may also be radial or lateral channels in various embodiments. The second recessed channels 422 and the third recessed channels 424 may each distribute from a midpoint where the channel receives delivery from the previous recessed channel where the previous channel connects with the channel. As illustrated, at the two distal ends of the third recessed channels may be defined an aperture 412, which may be an aperture of the plurality of apertures defined through the gasbox as previously described, and which may provide fluid access into the first plenum defined in the gasbox at the second surface as previously described. Any number of apertures may be defined to provide more uniform delivery. Although the apertures are shown aligned with an aperture at the opposite distal end of the recessed channel, in some embodiments, apertures 412 may be offset at different radial locations. By including additional precursor delivery paths through lid stacks or components of the present technology, a number of process improvements may be afforded. Wafer film thickness uniformity, material composition, and film properties may be further tuned to improve processes, limit in-plane or other distortion, and control film properties across the substrate.

Figure 5A:
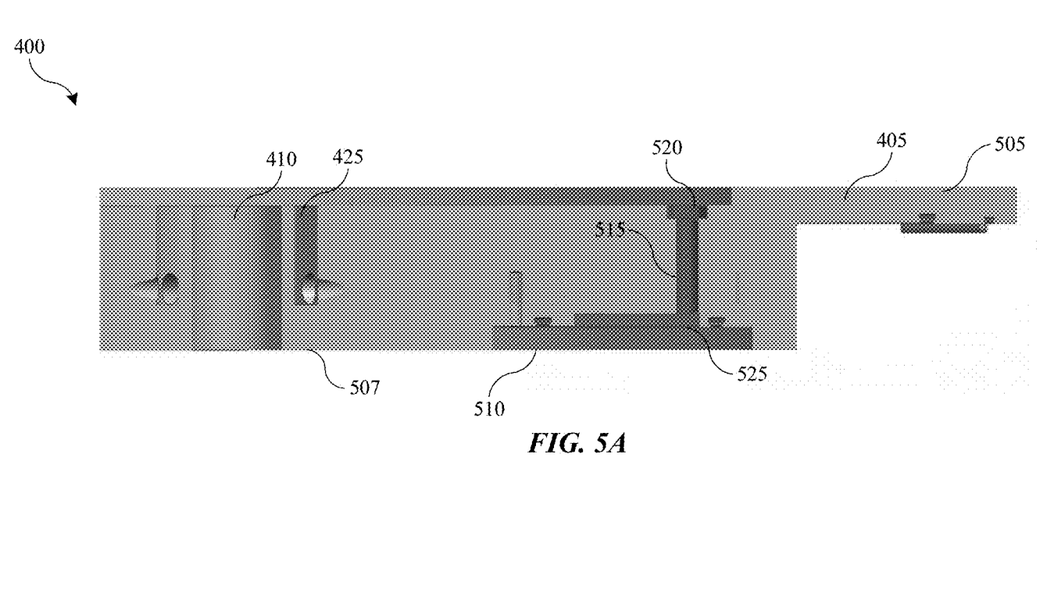
FIGS. 5A and 5B show schematic partial cross-sectional views of an exemplary gasbox according to some embodiments of the present technology.
Figure 5B:
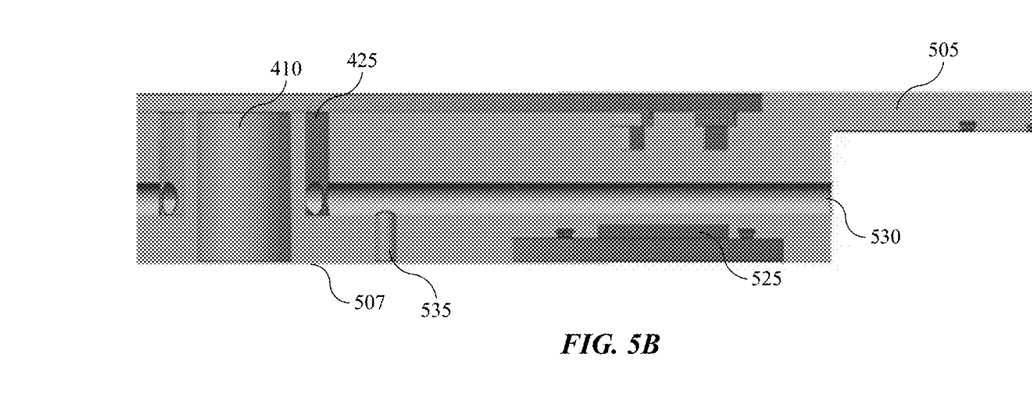

FIGS. 5A and 5B show schematic partial cross-sectional views of an exemplary gasbox 400 according to some embodiments of the present technology, and may show cross-sectional views respectively along line A and line B through gasbox 400 illustrated in FIG. 4. As discussed above, gasbox 400 may be included in any chamber previously described, and may include any feature, component, or characteristic previously discussed. For example, gasbox 400 as shown in FIG. 5A may include a first plate 505, which may define a number of features as previously discussed. The gasbox may define a central aperture 410 extending from a first surface 405 to a second surface 507 of the first plate of the gasbox, which may define an entire height of the gasbox in some embodiments, as second plate 510 may be recessed within first plate 505 as illustrated. First plate 505 may define an annular channel 425, which may extend about the central aperture, and may provide an additional flow path discussed below. Additionally, a plurality of apertures 515 may be defined through the first plate to provide fluid access from the recessed channel 520 to the first plenum 525. As illustrated, first plate 505 may define a stepped recess in the second surface of the plate, which may allow second plate 510 to be recessed within the plate, while allowing formation of a plenum 525, which may be an annular channel, for fluid delivery about the gasbox.

Turning to FIG. 5B, is shown another partial cross-sectional view of gasbox 400 through line B, which may not intersect any of the apertures 515 extending through the gasbox. As shown, a central aperture 410 may be formed through the first plate 505 of the gasbox, and an annular channel 425 may be formed about the central channel. As shown in this view, a number of lateral channels 530 may be formed extending from the annular channel 425 to an exterior edge of the gasbox, which may provide access to a separate zone of the faceplate as discussed above. Any number of lateral channels 425 may be formed within the gasbox, which may be formed between the plurality of apertures extending vertically through the gasbox and orthogonally to the lateral channels. The lateral channels may not intersect any aperture of the plurality of apertures extending through the first plate in some embodiments. The lateral channels may also extend between the first surface of the first plate and the plenum 525 formed within the first plate. As illustrated, a number of bypass apertures 535 may also be formed, which may provide fluid access from the lateral channels through the second surface 507 of the first plate. Any number of bypass apertures may be formed from each lateral channel, and the bypass apertures may be formed between the central aperture 410 and the plenum 525, which may be an annular plenum located radially outward of the bypass apertures.

Figure 6:
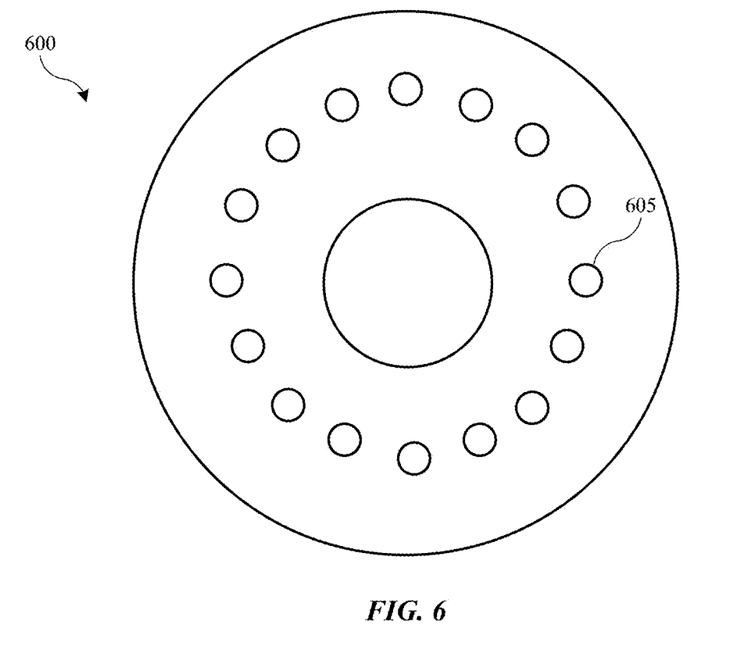
FIG. 6 shows a schematic view of an exemplary gasbox plate according to some embodiments of the present technology.

FIG. 6 shows a schematic view of an exemplary gasbox plate according to some embodiments of the present technology, and may illustrate a second plate as previously described. Second plate 600 may be an annular plate, which may be seated within a recess in a first plate of the gasbox as discussed above. Second plate 600 may be coupled with the first plate in any number of ways, and may define a number of outlet apertures 605 providing fluid access from the first plenum. As shown, outlet apertures 605 may be formed about second plate 600 in any number of patterns to provide or direct flow from a plenum formed within the gasbox. Although outlet apertures 605 are shown in a uniform distribution and of similar size, it is to be understood that outlet apertures 605 may be formed in any number of ways. For example, some apertures may be skipped, or spaced further apart, such as proximate any of the apertures extending through the gasbox, which may limit a direct flow path from the apertures through the gasbox, and may instead direct the flow through the plenum. Additionally, apertures may be of different sizes about the second plate. For example, apertures proximate the location where an aperture through the first plate delivers a fluid may be smaller than other apertures, which may ensure more equal flow or conductance through each of the outlet apertures of the second plate in embodiments of the present technology.

Figure 7:
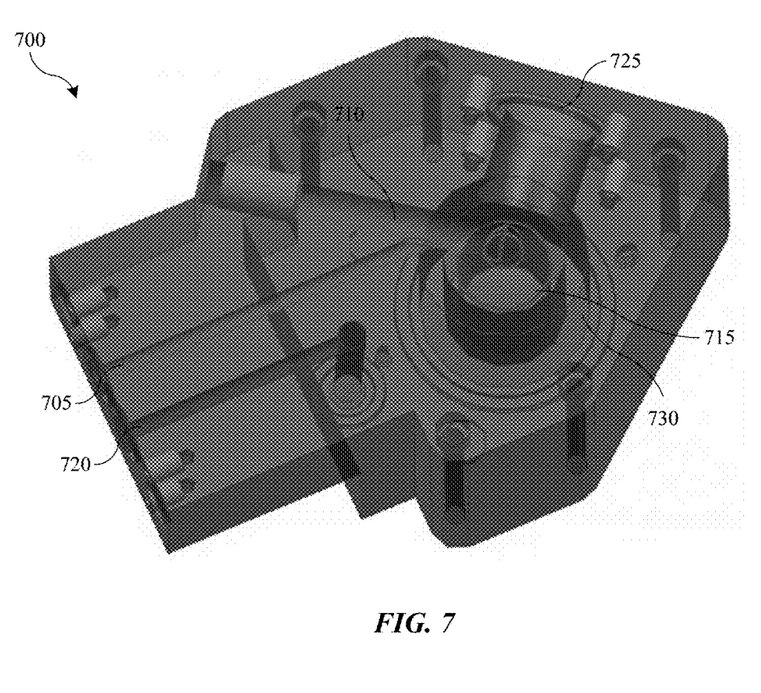
FIG. 7 shows a schematic partial perspective view of an exemplary output manifold 700 according to some embodiments of the present technology.

FIG. 7 shows a schematic perspective view of an exemplary output manifold 700 according to some embodiments of the present technology. Output manifold 700 may include any feature or characteristic of manifolds described previously, and may be used with any processing chamber previously described. Output manifold 700 may provide fluid access to the processing chamber by delivering one or more precursors or fluids to the gasbox. The manifold may define a first channel 705 configured to provide a first flow path for one or more precursors. The manifold may define a second flow channel 710, which may extend into an interior zone 715 of the output manifold, which may deliver precursors or fluids to the central aperture of the gasbox. First channel 705 may intersect second channel 710 within the manifold, which may allow inert precursors or one or more processing precursors to begin mixing prior to delivery to the interior zone 715, and delivery into the processing chamber.

A third channel 720 may be formed which may deliver one or more bypass precursors to a recessed channel of the gasbox. From the single entry location, the precursors may be distributed in a recursive pattern as previously described. This may provide a single location delivery, which may be offset from a central location, which may still be used to provide uniform delivery into a substrate processing chamber. Additionally, a fourth channel 725 may be formed through the output manifold for delivery of precursors, such as from a remote plasma unit, and which may be used for cleaning operations or any other process. Fourth channel 725 may deliver materials to an exterior zone 730, which may provide fluid access to the annular channel defined about the central aperture of the gasbox. Exterior zone 730 may be fluidly isolated from interior zone 715, and may limit backflow of precursors or plasma effluents into any of the other respective channels of the output manifold. By utilizing chamber components according to embodiments of the present technology, multiple fluid paths may be used to deliver precursors into a processing chamber, that may allow modulation of deposition about regions of a substrate being processed.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a channel" includes a plurality of such channels, and reference to "the aperture" includes reference to one or more apertures and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing chamber gasbox plate, comprising: a plate body having a first surface and a second surface opposite to the first surface, wherein the plate body defines: (i) a central aperture that extends from the first surface to the second surface; (ii) a plurality of apertures extending from the first surface to the second surface; (iii) an inner recessed channel within the first surface; (iv) an outer recessed channel within the first surface; and (v) an annular recess in the second surface, the annular recess being defined by an inner wall and an outer wall, wherein each of the inner wall and the outer wall is coaxial with the central aperture.

2. The semiconductor processing chamber gasbox plate of claim 1, wherein:
    each of the plurality of apertures extends into the annular recess.

3. The semiconductor processing chamber gasbox plate of claim 1, wherein:
    the outer recessed channel may be a stepped recess.

4. The semiconductor processing chamber gasbox plate of claim 1, wherein:
    the outer recessed channel extends about the central aperture in one or more directions.

5. The semiconductor processing chamber gasbox plate of claim 1, wherein:
    the outer recessed channel comprises a ledge.

6. The semiconductor processing chamber gasbox plate of claim 1, wherein:
    the inner recess channel comprises an annular channel extending about the central aperture.

7. The semiconductor processing chamber gasbox plate of claim 1, wherein:
    the plate body defines a delivery position that provides fluid access to the outer recessed channel.

8. The semiconductor processing chamber gasbox plate of claim 7, wherein:
    the delivery position is disposed radially inward of the outer recessed channel.

9. The semiconductor processing chamber gasbox plate of claim 1, wherein:
    the outer recessed channel provides fluid access to a number of radially outward locations on the plate body.

10. The semiconductor processing chamber gasbox plate of claim 1, wherein:
    the outer recessed channel comprises a recursive channel.

11. The semiconductor processing chamber gasbox plate of claim 10, wherein:
    the recursive channel extends radially outward to the plurality of apertures.

12. The semiconductor processing chamber gasbox plate of claim 11, wherein:
    the recursive channel comprises a first arc-shaped segment.

13. The semiconductor processing chamber gasbox plate of claim 12, wherein:
    an inlet of the first arc-shaped segment is disposed proximate a midpoint of the first arc-shaped segment.

14. The semiconductor processing chamber gasbox plate of claim 12, wherein:
    distal ends of the first arc-shaped segment comprise first radial segments that extend radially outward.

15. The semiconductor processing chamber gasbox plate of claim 14, wherein:
    second arc-shaped segments extend from each distal end of the first arc-shaped segment.

16. The semiconductor processing chamber gasbox plate of claim 15, wherein:
    distal ends of each second arc-shaped segment comprise second radial segments that extend radially outward.

17. The semiconductor processing chamber gasbox plate of claim 15, wherein:
    third arc-shaped segments extend from each distal end of the second arc-shaped segments.

18. The semiconductor processing chamber gasbox plate of claim 1, wherein:
   the plate body defines a plurality of lateral channels that extend from the inner recessed channel to an exterior edge of the plate body, wherein the plurality of lateral channels do not intersect any aperture of the plurality of apertures.

19. The semiconductor processing chamber gasbox plate of claim 18, wherein:
   the plate body defines a plurality of bypass apertures that extend from the lateral channels through the second surface.

* * * * *